US 9,369,098 B2

(12) United States Patent
Itakura et al.

(10) Patent No.: US 9,369,098 B2
(45) Date of Patent: Jun. 14, 2016

(54) INVERTING AMPLIFIER

(71) Applicant: Kabushiki Kaisha Toshiba, Minato-ku, Tokyo (JP)

(72) Inventors: Tetsuro Itakura, Nerima Tokyo (JP); Masanori Furuta, Odawara Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/621,133

(22) Filed: Feb. 12, 2015

(65) Prior Publication Data
US 2015/0263679 A1    Sep. 17, 2015

(30) Foreign Application Priority Data
Mar. 12, 2014    (JP) .................. 2014-049441

(51) Int. Cl.
*H03F 3/04*     (2006.01)
*H03F 3/30*     (2006.01)
*H03F 1/30*     (2006.01)

(52) U.S. Cl.
CPC .............. *H03F 3/3028* (2013.01); *H03F 1/308* (2013.01); *H03F 2200/291* (2013.01); *H03F 2203/30084* (2013.01); *H03F 2203/30117* (2013.01)

(58) Field of Classification Search
CPC ........................................ H03F 3/04
USPC ................................. 330/296, 285
See application file for complete search history.

(56) References Cited

U.S. PATENT DOCUMENTS 6,552,611 B2    4/2003    Yamamoto
6,753,730 B2    6/2004    Yamamoto (Continued)

FOREIGN PATENT DOCUMENTS

JP    2001-274641 A    10/2001
JP    2015-095830 A    5/2015
JP    2015-100036 A    5/2015

OTHER PUBLICATIONS

Thomas Christen, "A 15-bit 140-μW Scalable-Bandwidth Inverter-Based ΔΣ Modulator for a MEMS Microphone With Digital Output," IEEE Journal of Solid-State Circuits, vol. 48, No. 7, Jul. 2013, pp. 1605-1614—10 pages.

(Continued)

*Primary Examiner* — Henry Choe
(74) *Attorney, Agent, or Firm* — Knobbe, Martens, Olson & Bear, LLP

(57) ABSTRACT

An inverting amplifier according to a first embodiment includes an inverter circuit, a first voltage generating circuit, and a second voltage generating circuit. The inverter circuit has an input terminal, an output terminal, a first first-conductivity transistor, and a first second-conductivity transistor. The first (second) voltage generating circuit has a first (second) current source, a second first (second)-conductivity transistor, and a third first (second)-conductivity transistor. The first (second) current source supplies a predetermined current. The second first (second)-conductivity transistor has a control terminal with a predetermined bias voltage applied, and two ends connected to the other end of the first first (second)-conductivity transistor and the first (second) current source, respectively. The third first (second)-conductivity transistor has a control terminal connected to the other end of the second first (second)-conductivity transistor, and one end connected to one end of the second first (second)-conductivity transistor.

11 Claims, 10 Drawing Sheets

(56) References Cited

U.S. PATENT DOCUMENTS

| | | | |
|---|---|---|---|
| 8,988,154 B2* | 3/2015 | Zhang | 327/103 |
| 2002/0186072 A1* | 12/2002 | Mano | H03L 7/0995 327/538 |
| 2015/0130538 A1 | 5/2015 | Itakura et al. | |
| 2015/0137858 A1 | 5/2015 | Itakura et al. | |
| 2015/0263713 A1* | 9/2015 | Bode | H03K 5/1252 327/551 |

OTHER PUBLICATIONS

Vincenzo Peluso, et al., "A 900-m V Low-Power ΔΣ A/D Converter with 77-dB Dynamic Range," IEEE Journal of Solid-State Circuits, vol. 33, No. 12, Dec. 1998, pp. 1887-1897—11 pages.
Background Art Information, Toshiba, Feb. 5, 2015.
U.S. Appl. No. 14/540,059, Toshiba Corp.
U.S. Appl. No. 14/528,196, Toshiba Corp.

* cited by examiner

INVERTING AMPLIFIER

CROSS REFERENCE TO RELATED APPLICATION(S)

This application is based upon and claims the benefit of priority from the prior Japanese Patent Application No. 2014-049441, filed on Mar. 12, 2014, the entire contents of which are incorporated herein by reference.

FIELD

Embodiments described herein relate generally to an inverting amplifier.

BACKGROUND

As an inverting amplifier with high driving capability and simple configuration, an inverting amplifier that uses an inverter circuit has been employed. An inverting amplifier with an inverter circuit, however, has a problem of a large variation in electrical power consumption at an operating point when an input signal is 0, caused by variations in a threshold voltage or a power supply voltage of a transistor.

In order to solve the problem, there is proposed a circuit, in which an inverter circuit for amplification is set to have a predetermined power supply voltage which is generated so that an input-output connected replica inverter has a predetermined current.

With the circuit described above, an operating point when an input signal is 0 can be fixed. The circuit, however, suffers from another issue that the operating point varies depending on change in a threshold voltage of a transistor and cannot therefore be set freely.

Further, there is proposed another circuit that has a differential pair of two transistors, in which the transistors are controlled so that a predetermined current can flow in one of the transistors regardless of a gate voltage of the other transistor. How to apply the proposed circuit to an inverting amplifier with an inverter circuit, however, has not been disclosed.

For the reasons set forth above, an existing inverting amplifier with an inverter circuit is disadvantageous in that an operating point cannot be freely set when an input signal is 0.

DETAILED DESCRIPTION

Embodiments will now be explained with reference to the accompanying drawings. The present invention is not limited to the embodiments.

In one embodiment, an inverting amplifier includes an inverter circuit, a first voltage generating circuit, and a second voltage generating circuit.

The inverter circuit includes an input terminal, an output terminal, a first first-conductivity transistor, and a first second-conductivity transistor. The first first-conductivity transistor has a control terminal connected to the input terminal, an one end connected to the output terminal, and an other end. The first second-conductivity transistor has a control terminal connected to the input terminal, an one end connected to the output terminal, and an other end.

The first voltage generating circuit includes a first current source, a second first-conductivity transistor, and a third first-conductivity transistor. The first current source supplies a predetermined current. The second first-conductivity transistor has a control terminal with a predetermined bias voltage applied, an one end connected to the other end of the first first-conductivity transistor, and an other end connected to the first current source. The third first-conductivity transistor has a control terminal connected to the other end of the second first-conductivity transistor, an one end connected to the one end of the second first-conductivity transistor, and an other end.

The second voltage generating circuit includes a second current source, a second second-conductivity transistor, and a third second-conductivity transistor. The second current source supplies a predetermined current. The second second-conductivity transistor has a control terminal with a predetermined bias voltage applied, an one end connected to the other end of the first second-conductivity transistor, and an other end connected to the second current source. The third second-conductivity transistor has a control terminal connected to the other end of the second second-conductivity transistor, and an one end connected to the one end of the second second-conductivity transistor.

First Embodiment

Figure 1:
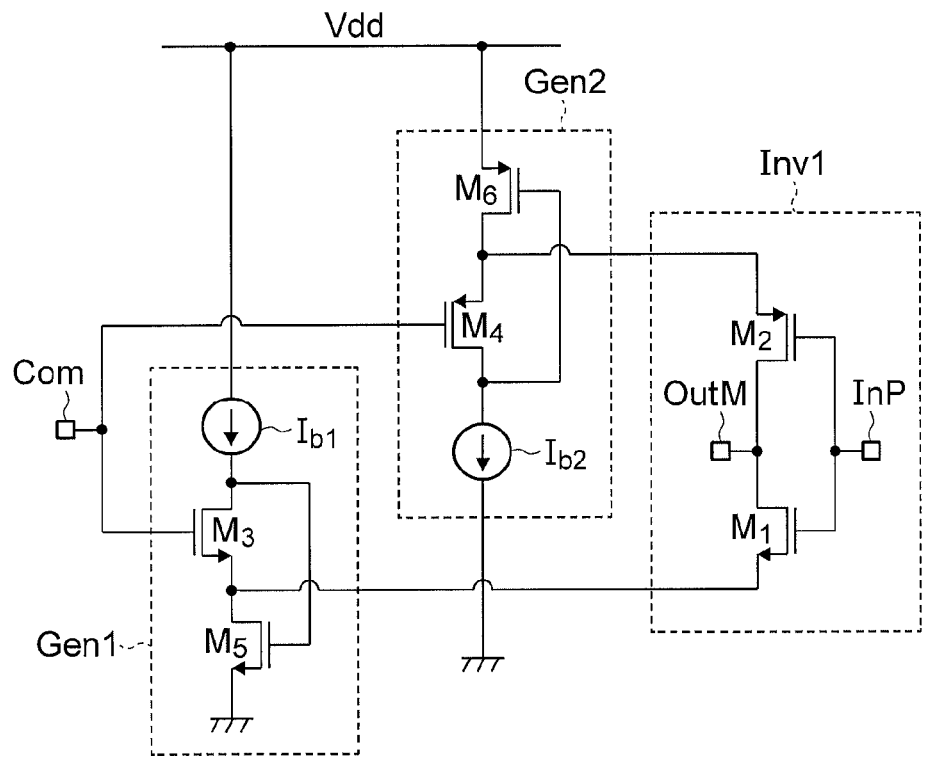
FIG. 1 is a circuit diagram illustrating an inverting amplifier according to a first embodiment.

An inverting amplifier according to a first embodiment will be now described with reference to FIG. 1. FIG. 1 is a circuit diagram illustrating the inverting amplifier according to the first embodiment. FIG. 1 shows an inverting amplifier that includes an inverter circuit Inv1, a voltage generating circuit Gen1 (first voltage generating circuit), and a voltage generating circuit Gen2 (second voltage generating circuit).

The inverter circuit Inv1 has an input terminal InP, an output terminal OutM, a transistor M1 (first first-conductivity transistor), and a transistor M2 (first second-conductivity transistor). The inverter circuit Inv1 receives an input signal input from the input terminal InP and outputs an output signal for the input signal from the output terminal OutM.

The transistor M1 is an N-channel MOS transistor (hereinafter referred to as "NMOS transistor"), and has a gate terminal (control terminal), a source terminal, and a drain terminal, which are connected to the input terminal InP, the voltage generating circuit Gen1, and the output terminal OutM, respectively.

The transistor M2 is a P-channel MOS transistor (hereinafter referred to as "PMOS transistor"), and has a gate terminal (control terminal), a source terminal, and a drain terminal, which are connected to the input terminal InP, the voltage generating circuit Gen2, and the output terminal OutM, respectively.

The voltage generating circuit Gen1 has a current source Ib1 (first current source), a transistor M3 (second first-conductivity transistor), and a transistor M5 (third first-conductivity transistor). The current source Ib1 has a higher-voltage side connected to a higher-voltage side power source Vdd, and a lower-voltage side connected to the transistors M3 and M5. The current source Ib1 supplies a predetermined current Ib1 to the transistor M3.

The transistor M3 is an NMOS transistor, and has a gate terminal (control terminal), a source terminal, and a drain terminal, the gate terminal being connected to a voltage source Com, the source terminal being connected to the source terminal of the transistor M1 and the drain terminal of the transistor M5, and the drain terminal being connected to the lower-voltage side of the current source Ib1 and the gate terminal of the transistor M5. To the gate terminal of the transistor M3, a predetermined voltage Vcom is applied from the voltage source Com.

The transistor M5 is an NMOS transistor, and has a gate terminal (control terminal), a source terminal, and a drain terminal, the gate terminal being connected to the lower-voltage side of the current source Ib1 and the drain terminal of the transistor M3, the source terminal being connected to the lower-voltage side of the power source (ground), and the drain terminal being connected to the respective source terminals of the transistors M1 and M3.

The voltage generating circuit Gen2 has a current source Ib2 (second current source), a transistor M4 (second second-conductivity transistor), and a transistor M6 (third second-conductivity transistor). The current source Ib2 has a higher-voltage side connected to the drain terminal of the transistor M4, and a lower-voltage side connected to the lower-voltage side of the power source (ground). The current source Ib2 supplies a predetermined current Ib2 to the transistor M4.

The transistor M4 is a PMOS transistor, and has a gate terminal (control terminal), a source terminal, and a drain terminal, the gate terminal being connected to the voltage source Com, the source terminal being connected to the source terminal of the transistor M2 and the drain terminal of the transistor M6, and the drain terminal being connected to the higher-voltage side of the current source Ib2 and the gate terminal of the transistor M6. To the gate terminal of the transistor M4, the predetermined voltage Vcom is applied from the voltage source Com.

The transistor M6 is a PMOS transistor, and has a gate terminal (control terminal), a source terminal, and a drain terminal, the gate terminal being connected to the higher-voltage side of the current source Ib2 and the drain terminal of the transistor M4, the source terminal being connected to the higher-voltage side of the power source Vdd, and the drain terminal being connected to the respective source terminals of the transistors M2 and M4.

The operations of the inverting amplifier of FIG. 1 will be next described.

The voltage generating circuit Gen1 operates so that the current Ib1 flows through the transistor M3 regardless of the magnitude of a drain current Im1 of the transistor M1. For example, when the transistor M3 has a drain current Im3 smaller than the current Ib1, the drain voltage of the transistor M3, that is, the gate voltage of the transistor M5 rises, whereby a drain current Im5 is increased, which causes the drain current Im3 of the transistor M3 to be increased. On the other hand, when the transistor M3 has a drain current Im3 larger than the current Ib1, the drain voltage of the transistor M3, that is, the gate voltage of the transistor M5 drops, whereby the drain current Im5 is reduced, which causes the drain current Im3 of the transistor M3 to be reduced.

Since the voltage generating circuit Gen1 is subjected to feedback for fixing the drain current Im3 to Ib1, the gate-to-source voltage Vgs3 of the transistor M3 is constant. Further, the gate voltage of the transistor M3 is fixed to a predetermined voltage Vcom. The source voltage of the transistor M3 is therefore fixed to Vcom−Vgs3.

Likewise, the voltage generating circuit Gen2 operates so that the current Ib2 flows through the transistor M4 regardless of the magnitude of a drain current Im2 of the transistor M2. For example, when the transistor M4 has a drain current Im4 smaller than the current Ib2, the drain voltage of the transistor M4, that is, the gate voltage of the transistor M6 drops, whereby a drain current Im6 is increased, which causes the drain current Im4 of the transistor M4 to be increased. On the other hand, when the transistor M4 has a drain current Im4 larger than the current Ib2, the drain voltage of the transistor M4, that is, the gate voltage of the transistor M6 increases, whereby the drain current Im6 is reduced, which causes the drain current Im4 of the transistor M4 to be reduced.

Since the voltage generating circuit Gen2 is subjected to feedback for fixing the drain current Im4 to Ib2, the gate-to-source voltage Vgs4 of the transistor M4 is constant. Further, the gate voltage of the transistor M4 is fixed to the predetermined voltage Vcom. The source voltage of the transistor M4 is therefore fixed to Vcom+Vgs4.

Since the source terminal of the transistor M3 is connected to the source terminal of the transistor M1 in the inverter circuit Inv1, the source voltage of the transistor M1 is fixed to Vcom−Vgs3. Accordingly, assuming that the ratio between the device size of the transistor M1 and that of the transistor M3 (ratio between the width and the length of the channel) is $\alpha$ to 1, the drain current Im1 of the transistor M1 is $\alpha$ (the above ratio) times as large as the drain current Im3 (=Ib1) of the transistor M3 (Im1=$\alpha$Ib1) in a case where through the input terminal InP a voltage Vinp, which is equal to the voltage Vcom, is input.

Since the gate-to-source voltage Vgs1 of the transistor M1 increases when the voltage Vinp is higher than the voltage Vcom, the drain current Im1 is larger than $\alpha$Ib1. On the other hand, since the gate-to-source voltage Vgs1 of the transistor M1 reduces when the voltage Vinp is lower than the voltage Vcom, the drain current Im1 is smaller than $\alpha$Ib1.

Likewise, since the source terminal of the transistor M4 is connected to the source terminal of the transistor M2 in the inverter circuit Inv1, the source voltage of the transistor M2 is fixed to Vcom+Vgs4. Accordingly, assuming that the ratio between the device size of the transistor M2 and that of the transistor M4 is $\beta$ to 1, the drain current Im2 of the transistor M2 is $\beta$ (the above ratio) times as large as the drain current Im4 (=Ib2) of the transistor M4 (Im2=$\beta$Ib2) in a case where through the input terminal InP a voltage Vinp, which is equal to the voltage Vcom, is input.

Since the gate-to-source voltage Vgs2 of the transistor M2 reduces when the voltage Vinp is higher than the voltage Vcom, the drain current Im2 is smaller than $\beta$Ib2. On the other hand, since the gate-to-source voltage Vgs2 of the transistor M2 increases when the voltage Vinp is lower than the voltage Vcom, the drain current Im2 is larger than $\beta$Ib1.

Hence, setting the device sizes of the transistors M1 to M4 and the currents Ib1 and Ib2 so that the relation of $\alpha$Ib1=$\beta$Ib2 is established can provide setting of the operating point of the inverter circuit Inv1. For example, when the relations of $\alpha$=$\beta$ and Ib1=Ib2 are set to be established, the drain currents of the transistors M1 and M2 when Vinp=Vcom are αIb1, and an output current Ioutm output from the output terminal OutM is 0.

When Vinp is higher than Vcom, the drain current Im1 of the transistor M1 is larger than αIb1 and the drain current Im2 of the transistor M2 is smaller than αIb1, as described above. Hence, the output terminal OutM draws into a current corresponding to the difference between the currents Im1 and Im2.

When Vinp is lower than Vcom, the drain current Im1 of the transistor M1 is smaller than αIb1 and the drain current Im2 of the transistor M2 is larger than αIb1, as described above. Hence, the output terminal OutM draws out the current corresponding to the difference between the currents Im1 and Im2.

In this way, the inverter circuit Inv1 operates as an inverting amplifier with the voltage Vcom used as an operating point voltage (bias voltage), and the difference between the input voltage Vinp and the bias voltage Vcom is amplified as a signal component. Further, the bias current flowing in the inverter circuit Inv1 at the operating point is αIb1.

As described above, in the inverting amplifier according to the present embodiment, the voltage at the operating point when an input signal is 0 (bias voltage) is Vcom. Accordingly, changing the voltage Vcom of the voltage source Com can achieve setting of the bias voltage to a desired value. Further, setting the device sizes of the transistors M1 to M4 and the currents Ib1 and Ib2 can provide setting of the bias current at the operating point. Therefore, the operating point can be set independently of the threshold voltages or the power supply voltages of the transistors, and variations in the electrical power consumption can be thus prevented.

Moreover, since the voltage source Com is shared as the voltage sources to be connected to the gate terminals of the transistors M3 and M4, the circuit configuration can be made simpler.

Second Embodiment

Figure 2:
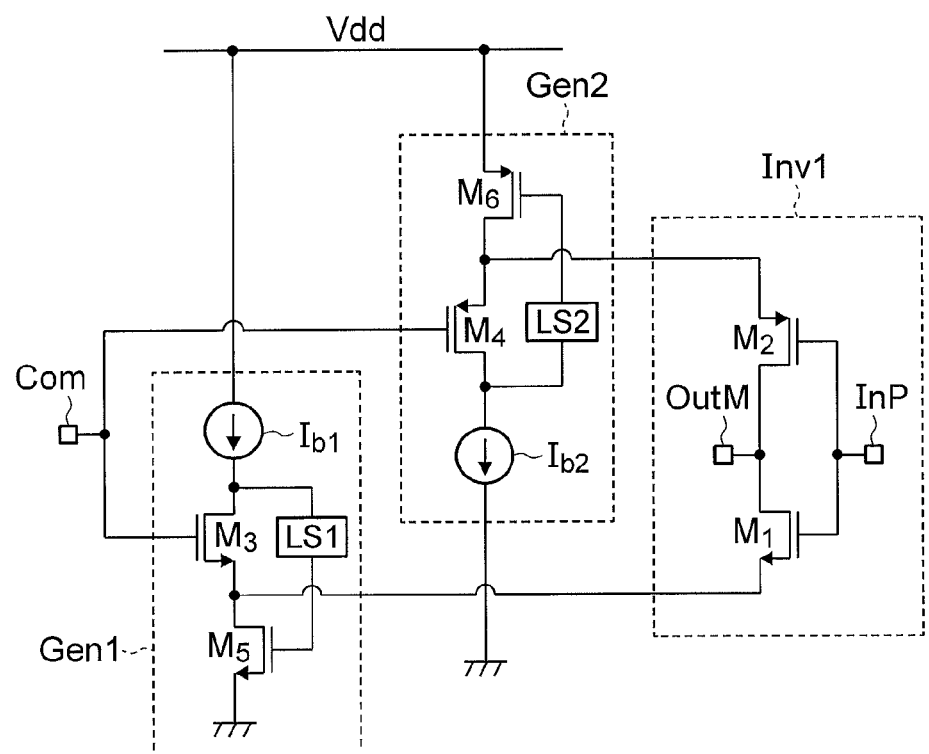
FIG. 2 is a circuit diagram illustrating an inverting amplifier according to a second embodiment.

An inverting amplifier according to a second embodiment will be described next with reference to FIGS. 2 to 6. FIG. 2 is a circuit diagram illustrating the inverting amplifier according to the second embodiment. FIG. 2 shows an inverting amplifier that further includes a level shift circuit LS1 (first level shift circuit) and a level shift circuit LS2 (second level shift circuit). The inverting amplifier according to the second embodiment is the same as that according to the first embodiment except for the provision of the level shift circuits LS1 and LS2.

The level shift circuit LS1 is provided between the drain terminal of the transistor M3 and the gate terminal of the transistor M5, and lowers the gate voltage of the transistor M5 so as to become lower than the drain voltage of the transistor M3.

The level shift circuit LS2 is provided between the drain terminal of the transistor M4 and the gate terminal of the transistor M6, and lowers the drain voltage of the transistor M4 so as to become lower than the gate voltage of the transistor M6.

With the above configurations, the second embodiment achieves a wider range in which the operating point of the inverter circuit Inv1 is set. More specifically, according to the second embodiment, it is possible to ensure the drain-to-source voltage Vds3 of the transistor M3 and the drain-to-source voltage Vds4 of the transistor M4, and expand a range of power supply voltages where the transistors M3 and M4 are capable of operating in a saturation region.

In the voltage generating circuit Gen1, in a case where the voltage Vcom determining the voltage at the operating point is set to the intermediate voltage Vdd/2 between the power source Vdd and the power source (ground), increase in the power source Vdd causes the source voltage of the transistor M3 to increase as well, since the gate-to-source voltage Vgs3 of the transistor M3 is constant. As a result, the drain-to-source voltage Vds5 of the transistor M5 becomes higher.

Because the gate-to-source voltage Vgs5 of the transistor M5 is equal to the sum of the drain-to-source voltages Vds3 and Vds5 of the transistors M3 and M5, increase in the drain-to-source voltage Vds5 of the transistor M5 leads to decrease in the drain-to-source voltage Vds3 of the transistor M3. This makes it more difficult to ensure the drain-to-source voltage Vov3 which allows the transistor M3 to operate in the saturation region, whereby undesirable operations of the inverting amplifier can cause.

According to the embodiment, with the provision of the level shift circuit LS1, the sum of the gate-to-source voltage Vgs5 of the transistor M5 and a level shift voltage Vls1 of the level shift circuit LS1 becomes equal to the sum of the drain-to-source voltages Vds3 and Vds5 of the transistors M3 and M5. Hence, the drain-to-source voltage Vds3 of the transistor M3 is represented by Vgs5+Vls1−Vds5. This shows that the provision of the level shift circuit increases the voltage Vds3 by Vls1 than when the level shift circuit is not employed.

In this way, it becomes possible to prevent the drain-to-source voltage Vds3 of the transistor M3 from becoming lower than the drain-to-source voltage Vov3 of the transistor M3 which allows the transistor M3 to operate in the saturation region. The second embodiment thus achieves a wider range of the power supply voltage which allows the transistor M3 to operate in the saturation region, ensuring the drain-to-source voltage Vov3 of the transistor M3.

Figure 3:
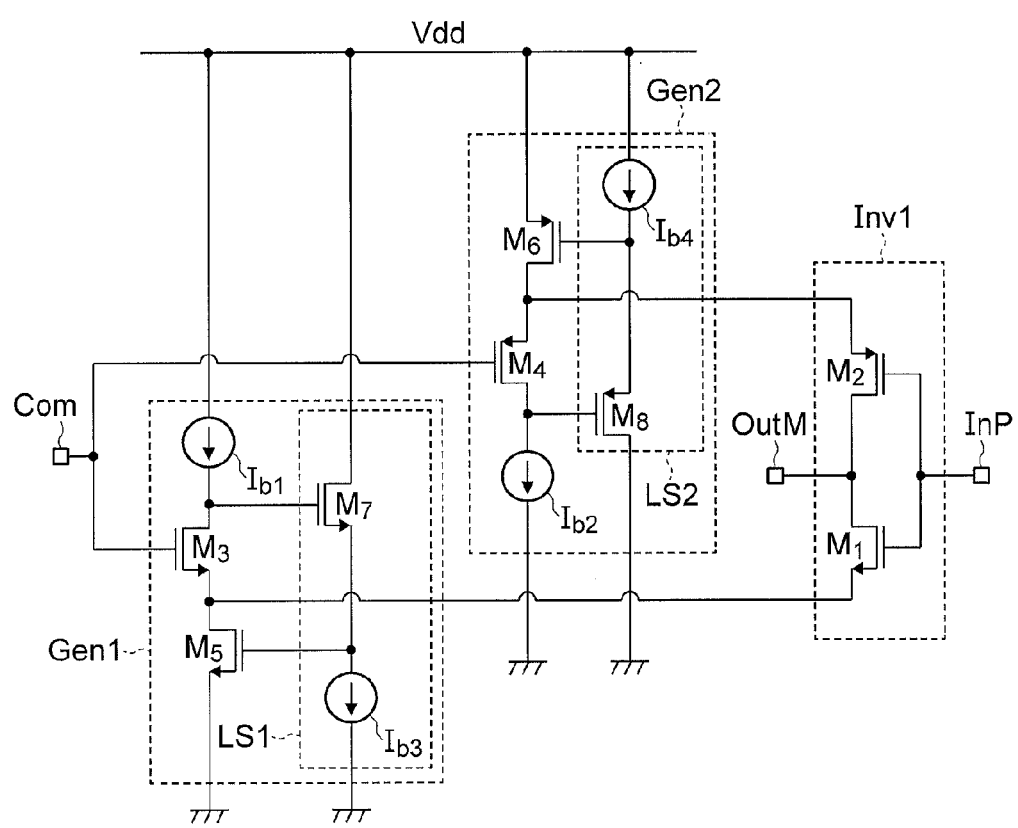
FIG. 3 is a circuit diagram illustrating an example of the inverting amplifier according to the second embodiment.

FIGS. 3 to 6 are each circuit diagrams illustrating an example of the inverting amplifier according to the second embodiment. FIG. 3 shows an inverting amplifier including the level shift circuits LS1 and LS2 each made of a source follower circuit. More specifically, the level shift circuit LS1 includes a current source Ib3 (third current source) and a transistor M7 (fourth first-conductivity transistor), and the level shift circuit LS2 includes a current source Ib4 (fourth current source) and a transistor M8 (fourth second-conductivity transistor).

The current source Ib3 has a higher-voltage side connected to the source terminal of the transistor M7 and the gate terminal of the transistor M5, and a lower-voltage side connected to the lower-voltage side power source (ground). The current source Ib3 supplies a predetermined current Ib3 to the transistor M7.

The transistor M7 is an NMOS transistor, and has a gate terminal (control terminal), a source terminal, and a drain terminal, the gate terminal being connected to the lower-voltage side of the current source Ib1 and the drain terminal of the transistor M3, the source terminal being connected to the higher-voltage side of the current source Ib3 and the gate terminal of the transistor M5, and the drain terminal being connected to the higher-voltage side power source Vdd.

With the configuration, the gate voltage of the transistor M5 is lower than the drain voltage of the transistor M3 by the gate-to-source voltage Vgs7 of the transistor M7.

Further, the current source Ib4 has a lower-voltage side connected to the source terminal of the transistor M8 and the gate terminal of the transistor M6, and a higher-voltage side connected to the higher-voltage side power source Vdd. The current source Ib4 supplies a predetermined current Ib4 to the transistor M8.

The transistor M8 is a PMOS transistor, and has a gate terminal (control terminal), a source terminal, and a drain terminal, the gate terminal being connected to the drain terminal of the transistor M4 and the higher-voltage side of the current source Ib2, the source terminal being connected to the lower-voltage side of the current source Ib4 and the gate terminal of the transistor M6, and the drain terminal being connected to the lower-voltage side power source (ground).

With the configuration, the drain voltage of the transistor M4 is lower than the gate voltage of the transistor M6 by the gate-to-source voltage Vgs8 of the transistor M8.

Figure 4:
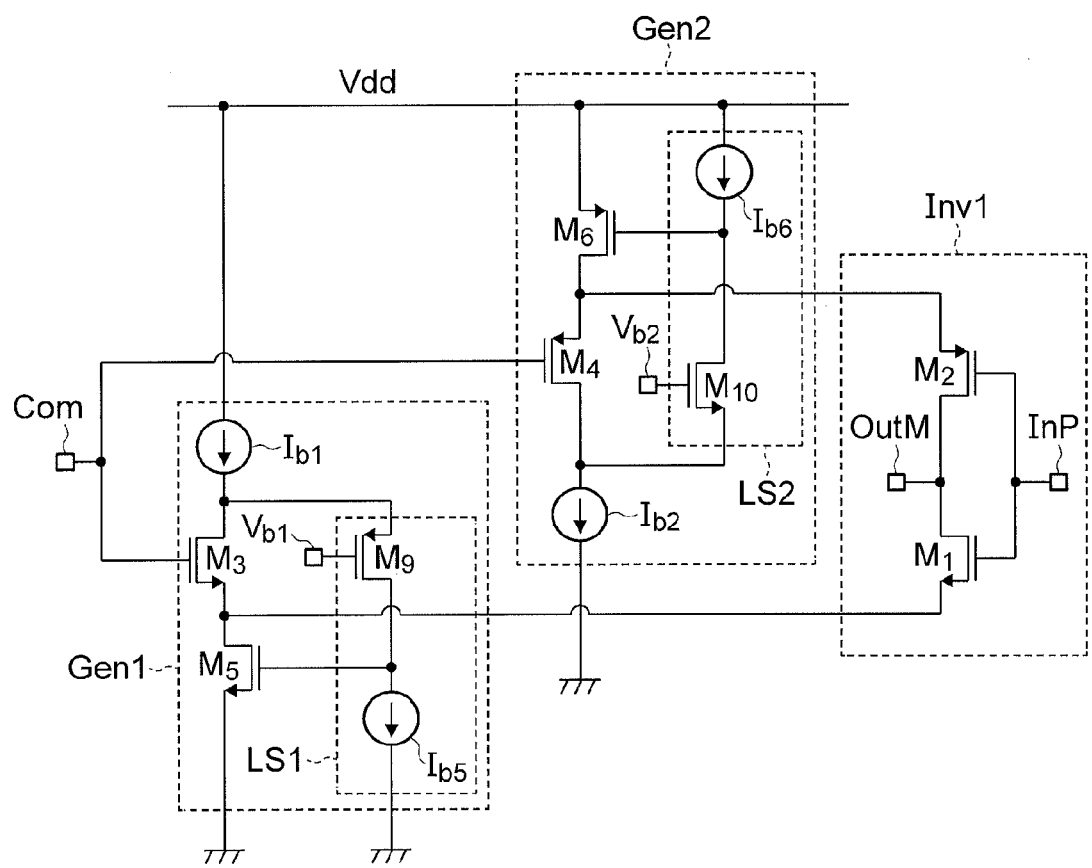
FIG. 4 is a circuit diagram illustrating an example of the inverting amplifier according to the second embodiment.

FIG. 4 shows an inverting amplifier including the level shift circuits LS1 and LS2 each formed of a common-gate amplifier. More specifically, the level shift circuit LS1 has a current source Ib5 (fifth current source) and a transistor M9 (fifth second-conductivity transistor), and the level shift circuit LS2 has a current source Ib6 (sixth current source) and a transistor M10 (fifth first-conductivity transistor).

The current source Ib5 has a higher-voltage side connected to the drain terminal of the transistor M9 and the gate terminal of the transistor M5, and a lower-voltage side connected to the lower-voltage side power source (ground). The current source Ib5 supplies a predetermined current Ib5 to the transistor M9.

The transistor M9 is a PMOS transistor, and has a gate terminal (control terminal), a source terminal, and a drain terminal, the gate terminal receiving a predetermined voltage Vb1, the source terminal being connected to the drain terminal of the transistor M3 and the lower-voltage side of the current source Ib1, and the drain terminal being connected to the higher-voltage side of the current source Ib5 and the gate terminal of the transistor M5. The transistor M9 forms a common-gate amplifier.

With the configuration, the gate voltage of the transistor M5 is lower than the drain voltage of the transistor M3 by the drain-to-source voltage Vds9 of the transistor M9.

Further, the current source Ib6 has a lower-voltage side connected to the drain terminal of the transistor M10 and the gate terminal of the transistor M6, and a higher-voltage side connected to the higher-voltage side power source Vdd. The current source Ib6 supplies a predetermined current Ib6 to the transistor M10.

The transistor M10 is an NMOS transistor, and has a gate terminal (control terminal), a source terminal, and a drain terminal, the gate terminal receiving a predetermined voltage Vb2, the source terminal being connected to the drain terminal of the transistor M4 and the higher-voltage side of the current power Ib2, and the drain terminal being connected to the lower-voltage side of the current source Ib6 and the gate terminal of the transistor M6. The transistor M10 forms a common-gate amplifier.

With the configuration, the drain voltage of the transistor M4 is lower than the gate voltage of the transistor M6 by the drain-to-source voltage Vds10 of the transistor M10.

Figure 5:
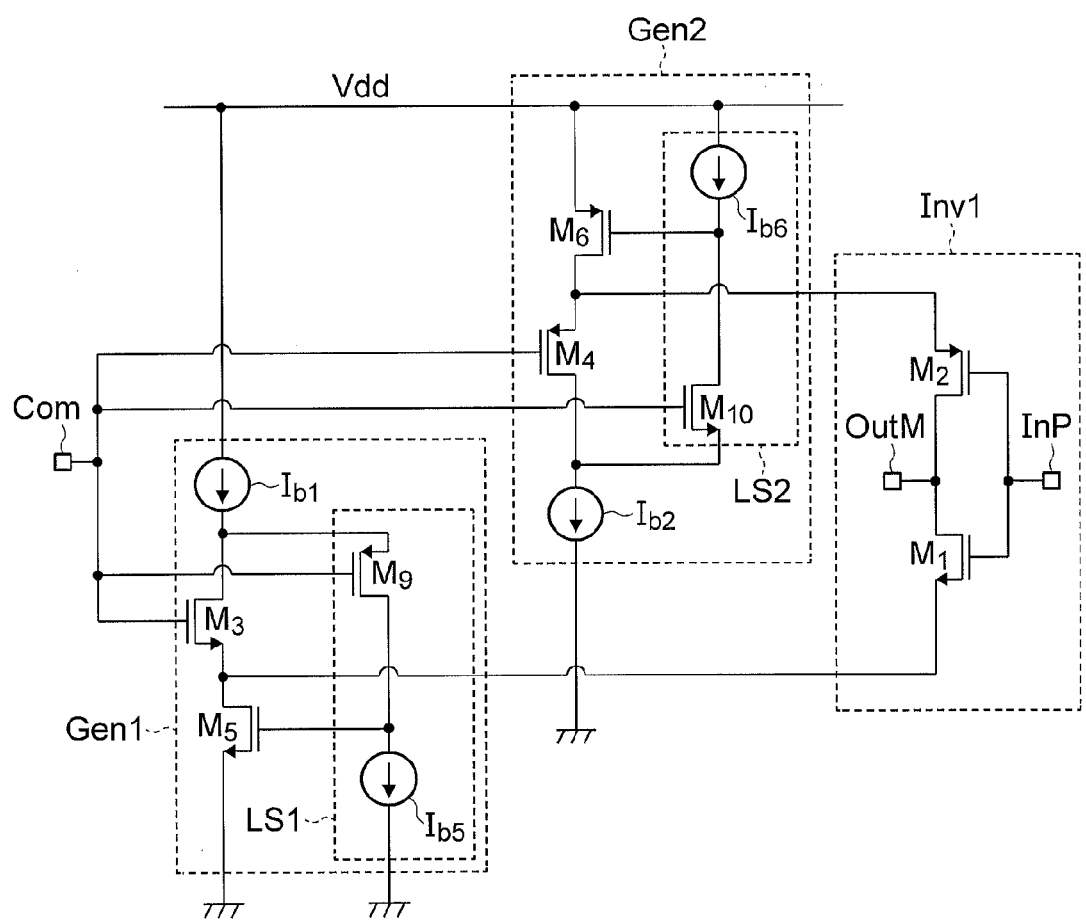
FIG. 5 is a circuit diagram illustrating an example of the inverting amplifier according to the second embodiment.

Note that the gate terminals of the transistors M9 and M10 may be optionally connected to the voltage source Com as shown in FIG. 5. In that case, the voltage Vcom is equally applied to the gate terminals of the transistors M3, M4, M9, and M10. Sharing the voltage source Com provides a simpler configuration of the inverting amplifier.

Figure 6:
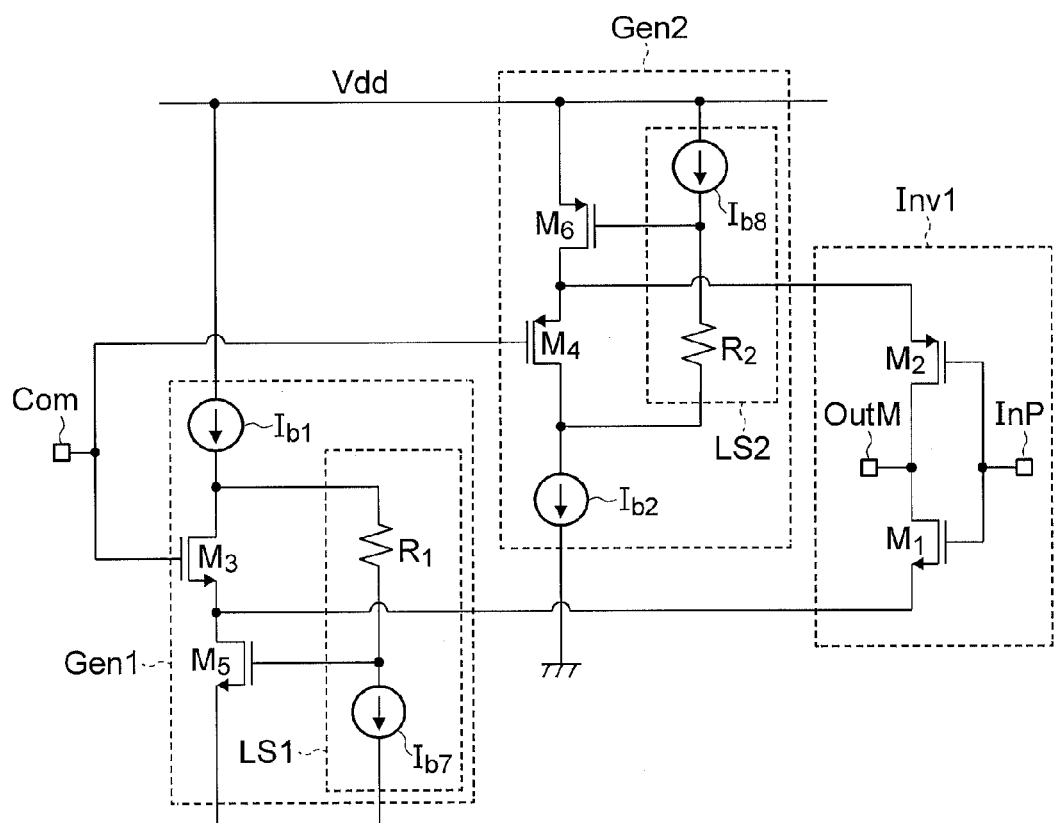
FIG. 6 is a circuit diagram illustrating an example of the inverting amplifier according to the second embodiment.

FIG. 6 shows an inverting amplifier including the level shift circuits LS1 and LS2 each formed of a current source and a resistance element. More specifically, the level shift circuit LS1 has a current source Ib7 (seventh current source) and a resistance element R1 (first resistance element), and the level shift circuit LS2 has a current source Ib8 (eighth current source) and a resistance element R2 (second resistance element).

The resistance element R1 has one terminal connected to the drain terminal of the transistor M3 and the lower-voltage side of the current source Ib1, and the other terminal connected to the gate terminal of the transistor M5 and the higher-voltage side of the current source Ib7.

The current source Ib7 has a higher-voltage side connected to the other terminal of the resistance element R1 and the gate terminal of the transistor M5, and a lower-voltage side connected to the lower-voltage side power source (ground). The current source Ib7 supplies a predetermined current Ib7 to the resistance element R1.

With the configuration, the gate voltage of the transistor M5 is lower than the drain voltage of the transistor M3 by the the voltage across the resistance element R1.

The resistance element R2 has one terminal connected to the drain terminal of the transistor M4 and the higher-voltage side of the current source Ib2, and the other terminal connected to the gate terminal of the transistor M6 and the lower-voltage side of the current source Ib8.

The current source Ib8 has a lower-voltage side connected to the other terminal of the resistance element R2 and the gate terminal of the transistor M6, and a higher-voltage side connected to the higher-voltage side power source Vdd. The current source Ib8 supplies a predetermined current Ib8 to the resistance element R2.

With the configuration, the drain voltage of the transistor M4 is lower than the gate voltage of the transistor M6 by the the voltage across the resistance element R2.

In the embodiment, the configurations of the level shift circuits LS1 and LS2 may be freely selected, and may be the same as those in the inverting amplifier shown in any of FIGS. 3 to 6 or different therefrom.

Third Embodiment

An inverting amplifier according to a third embodiment will be described next with reference to FIG. 7. The inverting amplifier Inv1 according to the third embodiment further includes a cascode transistor M11 (sixth first-conductivity transistor) for the transistor M1, and a cascode transistor M12 (sixth second-conductivity transistor) for the transistor M2. The voltage generating circuits Gen1 and Gen2 have the same configuration as that in the inverting amplifier shown in FIG. 3.

The transistor M11 is an NMOS transistor, and has a gate terminal (control terminal), a source terminal, and a drain terminal, the gate terminal receiving a predetermined voltage, the source terminal being connected to the drain terminal of the transistor M1, and the drain terminal being connected to the output terminal OutM. In other words, the transistor M11 is cascode-connected between the drain terminal of the transistor M1 and the output terminal OutM.

The transistor M12 is a PMOS transistor, and has a gate terminal (control terminal), a source terminal, and a drain terminal, the gate terminal receiving a predetermined voltage, the source terminal being connected to the drain terminal of the transistor M2, and the drain terminal being connected to the output terminal OutM. In other words, the transistor M12 is cascode-connected between the drain terminal of the transistor M2 and the output terminal OutM.

With the configuration, it becomes possible to increase the output resistance for the inverter circuit Inv1, thereby improving the direct current gain.

Figure 7:
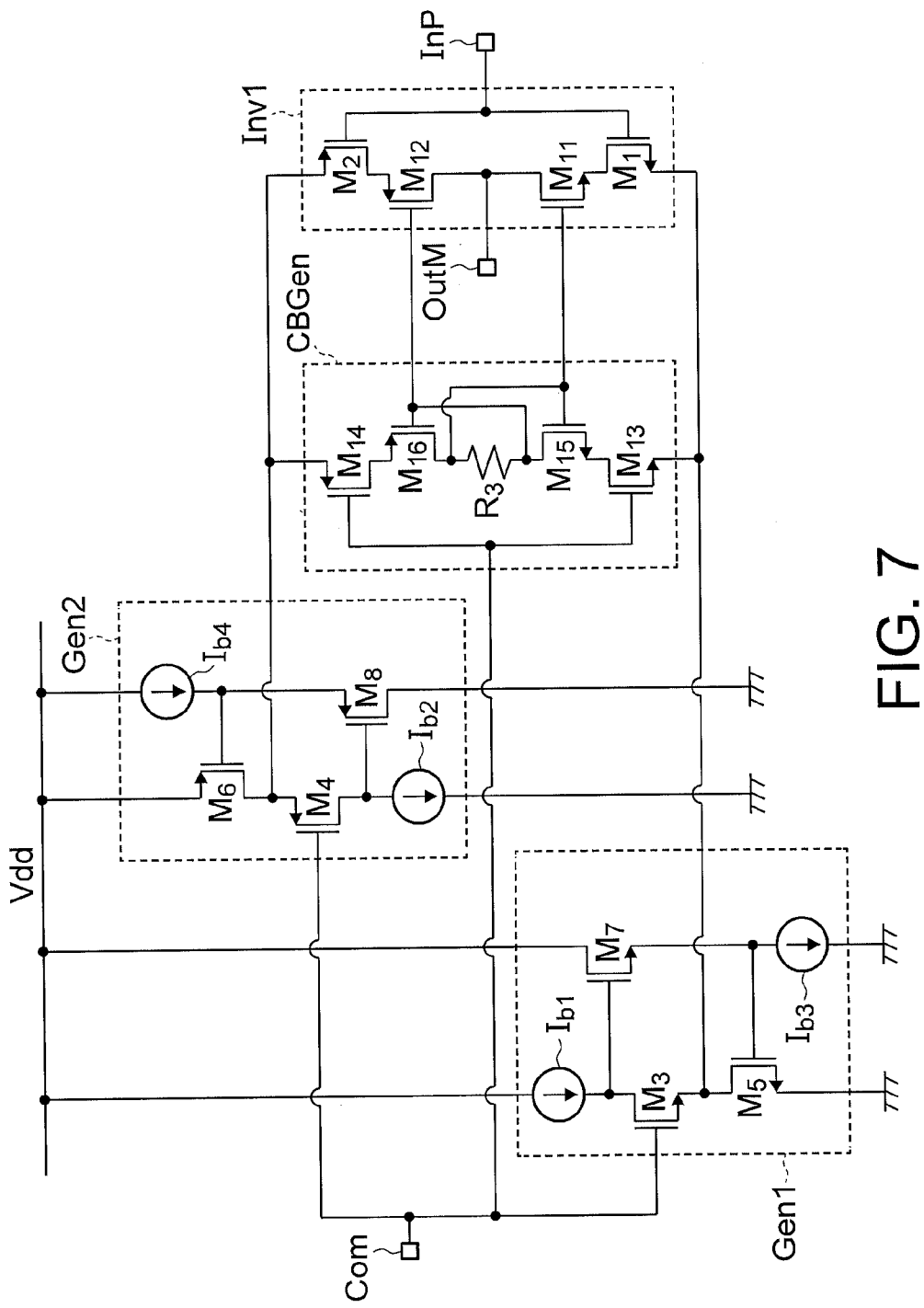
FIG. 7 is a circuit diagram illustrating an example of an inverting amplifier according to a third embodiment.

The inverting amplifier of FIG. 7 furthermore includes a voltage generating circuit CBGen for applying a predetermined voltage to the gate terminals of the transistors M11 and M12. The generating circuit CBGen has transistors M13 to M16 and a resistance element R3.

The transistor M13 is an NMOS transistor, and has a gate terminal (control terminal), a source terminal, and a drain terminal, the gate terminal being connected to the voltage source Com, the source terminal being connected to the source terminal of the transistor M1, and the drain terminal being connected to the source terminal of the transistor M15. To the gate terminal of the transistor M13, a predetermined voltage Vcom is applied.

The transistor M14 is a PMOS transistor, and has a gate terminal (control terminal), a source terminal, and a drain terminal, the gate terminal being connected to the voltage source Com, the source terminal being connected to the source terminal of the transistor M2, and the drain terminal being connected to the source terminal of the transistor M16. To the gate terminal of the transistor M14, a predetermined voltage Vcom is applied.

The transistor M15 is an NMOS transistor, and has a gate terminal (control terminal), a source terminal, and a drain terminal, the gate terminal being connected to the gate terminal of the transistor M11, one terminal of the resistance element R3, and the drain terminal of the transistor M16, the source terminal being connected to the drain terminal of the transistor M13, and the drain terminal being connected to the respective gate terminals of the transistors M12 and M16 and the other terminal of the resistance element R3.

The transistor M16 is a PMOS transistor, and has a gate terminal (control terminal), a source terminal, and a drain terminal, the gate terminal being connected to the gate terminal of the transistor M12, the other terminal of the resistance element R3, and the drain terminal of the transistor M15, the source terminal being connected to the drain terminal of the transistor M14, and the drain terminal being connected to the respective gate terminals of the transistors M11 and M15 and one terminal of the resistance element R3.

Allowing the transistors M13 and M14 to operate in the saturation region in the voltage generating circuit CBGen described above requires setting the respective drain-to-source voltages Vds13 and Vds14 of the transistors M13 and M14 to be higher than the respective overdrive voltages Vov13 and Vov14 of the transistors M13 and M14, respectively. In other words, the formula of Vds13+|Vds14|>Vov13+|Vov14| (Formula 1) needs to be satisfied.

Further, if the channel width/channel length is selected so that the gate-to-source voltages of the transistors M15 and M16 do not exceed the gate-to-source voltages of the transistors M13 and M14, the formula of Vds13+|Vds14|=Vgs13+|Vgs14|−(Vgs15+|Vgs16|−Vr3)>Vr3 (Formula 2) where Vr3 (>0) denotes the voltage across the resistance element R3 is established.

Hence, the transistors M13 and M14 becomes capable of operating in the saturation region in such a manner that the voltage Vr3 across the resistance R3 is designed to be higher than the sum of the overdrive voltages of the transistors M13 and M14 (Vov13+|Vov14|). Further, with the voltage generating circuit CBGen thus designed, the transistors M1 and M2 of the inverter circuit Inv1 are allowed to operate in the saturation region in such a manner that a voltage is applied to the gate terminals of the transistors M11 and M12.

It is to be noted that the voltage generating circuit CBGen is not limited to that configured as shown in FIG. 7 and may employ any configuration as long as the transistors M11 and M12 can receive a predetermined voltage.

Fourth Embodiment

Figure 8:
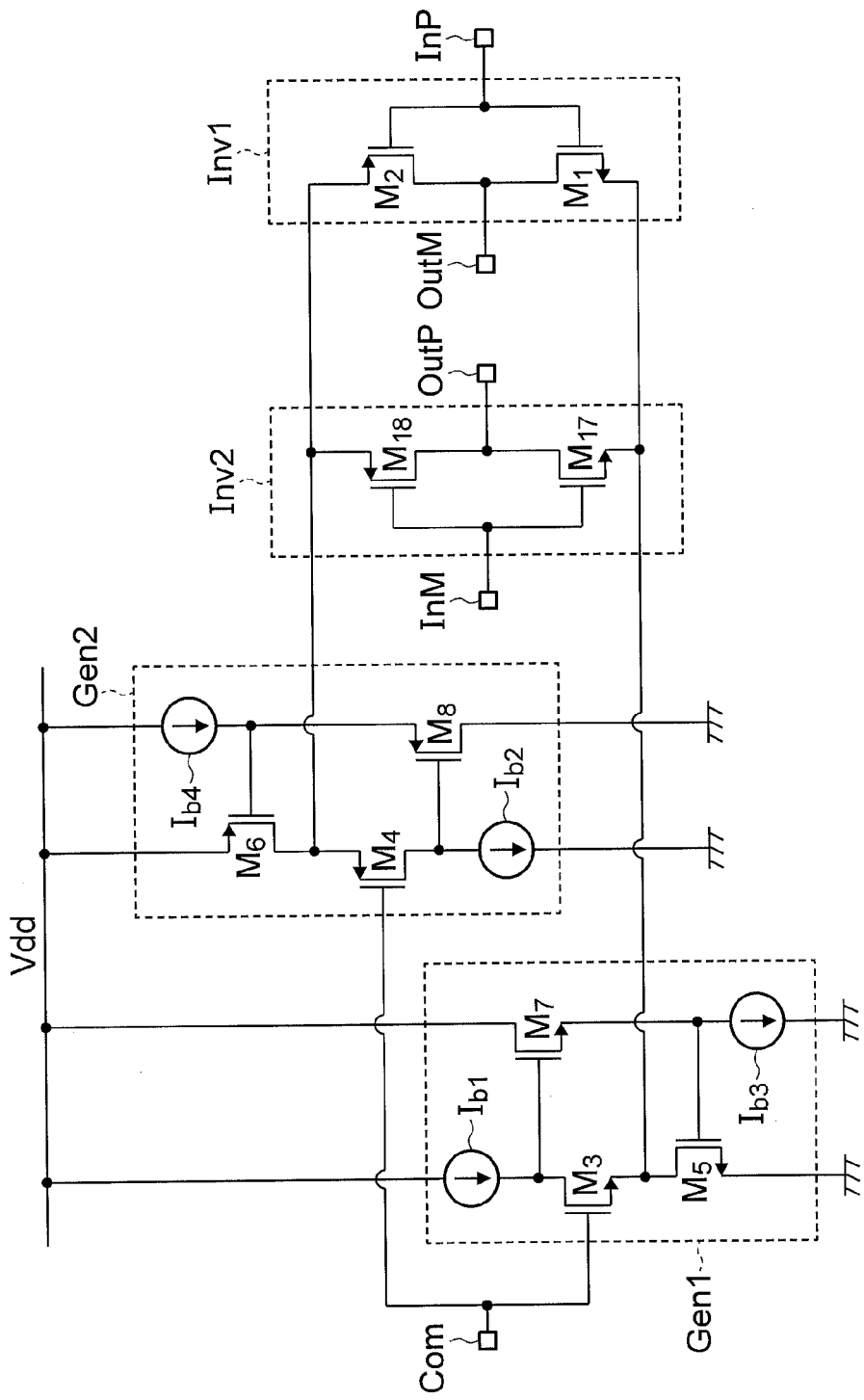
FIG. 8 is a circuit diagram illustrating an inverting amplifier according to a fourth embodiment.

An inverting amplifier according to a fourth embodiment will be described next with reference to FIGS. 8 to 11. The inverting amplifier according to the fourth embodiment includes a plurality of inverter circuits. FIG. 8 is a circuit diagram illustrating an inverting amplifier having two inverter circuits Inv1 and Inv2. In FIG. 8, the inverting amplifier according to the fourth embodiment has the same configuration as that shown in FIG. 3 except for the provision of the inverter circuit Inv2.

The inverter circuit Inv2 has an input terminal InM, an output terminal OutP, a transistor M17, and a transistor M18. The inverter circuit Inv2 receives an input signal from the input terminal InM and outputs an output signal for the input signal from the output terminal OutP.

The transistor M17 is an NMOS transistor, and has a gate terminal (control terminal), a source terminal, and a drain terminal, which are connected to the input terminal InM, the voltage generating circuit Gen1, and the output terminal OutP, respectively.

The transistor M18 is a PMOS transistor, and has a gate terminal (control terminal), a source terminal, and a drain terminal, which are connected to the input terminal InM, the voltage generating circuit Gen2, and the output terminal OutP, respectively.

With the above configuration, the inverter circuit Inv2 operates in the similar manner as the inverter circuit Inv1. More specifically, the inverter circuit Inv2 inverting-amplifies an input signal received from the input terminal InM, and outputs the amplified signal from the output terminal OutP. Accordingly, the inverting amplifier of FIG. 8 is allowed to operate as a differential amplifier by receiving a differential signal from each of the two input terminals InP and InM.

Figure 9:
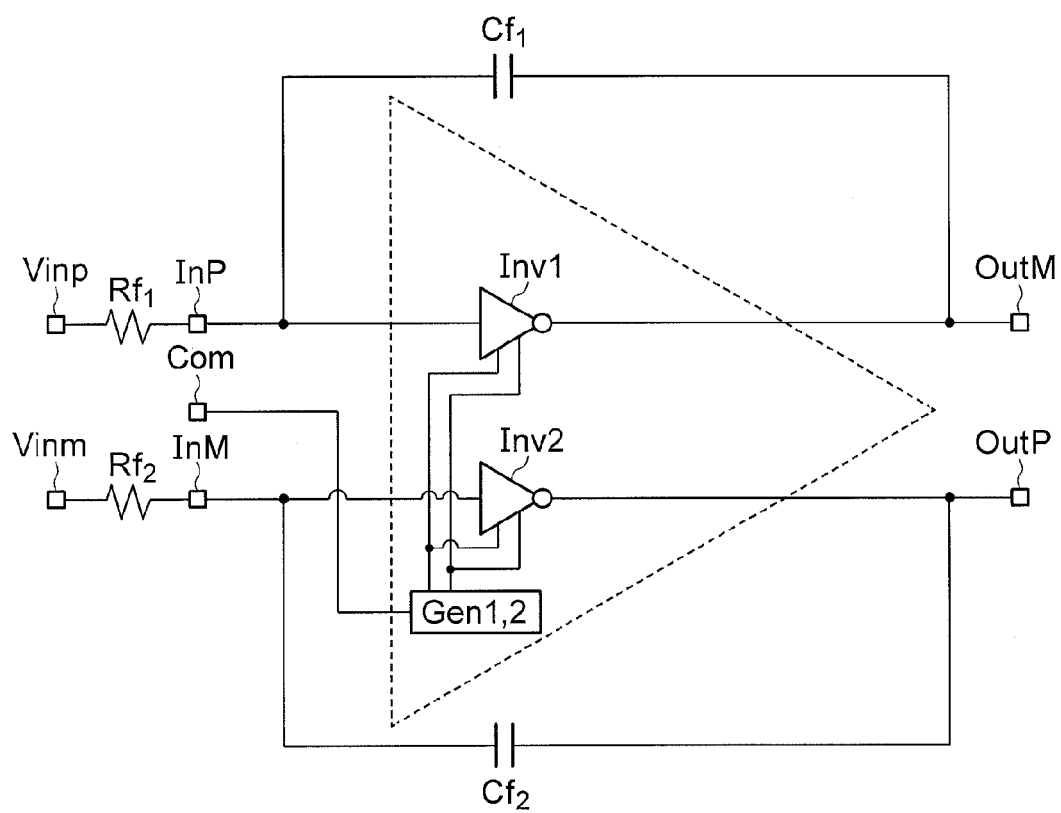
FIG. 9 is a circuit diagram illustrating an integrating circuit equipped with the inverting amplifier of FIG. 8.

FIG. 9 is a circuit diagram illustrating an integrating circuit equipped with the inverting amplifier of FIG. 8. The integrating circuit of FIG. 9 includes the inverting amplifier of FIG. 8, input terminals Vinp and Vinm, resistance elements Rf1 and Rf2, and capacitative elements Cf1 and Cf2.

The input terminal Vinp is connected to the input terminal InP of the inverter circuit Inv1 via the resistance element Rf1, and the input terminal Vinm is connected to the input terminal InM of the inverter circuit Inv2 via the resistance element Rf2. Further, the capacitative element Cf1 is connected between the input terminal InP and the output terminal OutM of the inverter circuit Inv1, and the capacitative element Cf2 is connected between the input terminal InM and the output terminal OutP of the inverter circuit Inv2.

With the configuration described above, the capacitative elements Cf1 and Cf2 are charged in response to inputs of the voltages Vinp and Vinm from the input terminals Vinp and Vinm, and the voltages of the charged capacitative elements Cf1 and Cf2 are output from the output terminals OutM and OutP. The output voltages output from the output terminals OutM and OutP correspond to a voltage obtained by integrating the input voltages Vinp and Vinm.

Further, the integrating circuit of FIG. 9 is subjected to common-mode feedback for fixing the common-mode voltage of output voltages output from the output terminals OutM and OutP. For example, when the common-mode voltage of the output voltages is higher (lower) than a predetermined voltage, the common-mode voltage of input voltages from the input terminals Inp and InM of the inverter circuits Inv1 and Inv2 are higher (lower) than the bias voltage Vcom set by the voltage source Corn.

In other words, the transistors M1 and M17 of the inverter circuits Inv1 and Inv2 have a gate voltage higher (lower) than the gate voltage Vcom of the transistor M3 of the voltage generating circuit Gen1. Accordingly, the transistors M1 and M17 have a drain current larger (smaller) than a current the times of the device size ratio as large as the drain current Ib1 of the transistor M3.

Likewise, the transistors M2 and M18 of the inverter circuits Inv1 and Inv2 have a gate voltage higher (lower) than the gate voltage Vcom of the transistor M4 of the voltage generating circuit Gen2. Accordingly, the transistors M2 and M18 have a drain current smaller (larger) than a current the times of the device size ratio as large as the drain current Ib2 of the transistor M4.

Therefore, the inverter circuits Inv1 and Inv2 operate so as to draw into (out) a current. Through this operation, the capacitative elements Cf1 and Cf2 are discharged (charged) and the common mode voltages of output voltages from the output terminals OutM and OutP become higher (lower), whereby the common-mode voltage can be fixed.

Figure 10:
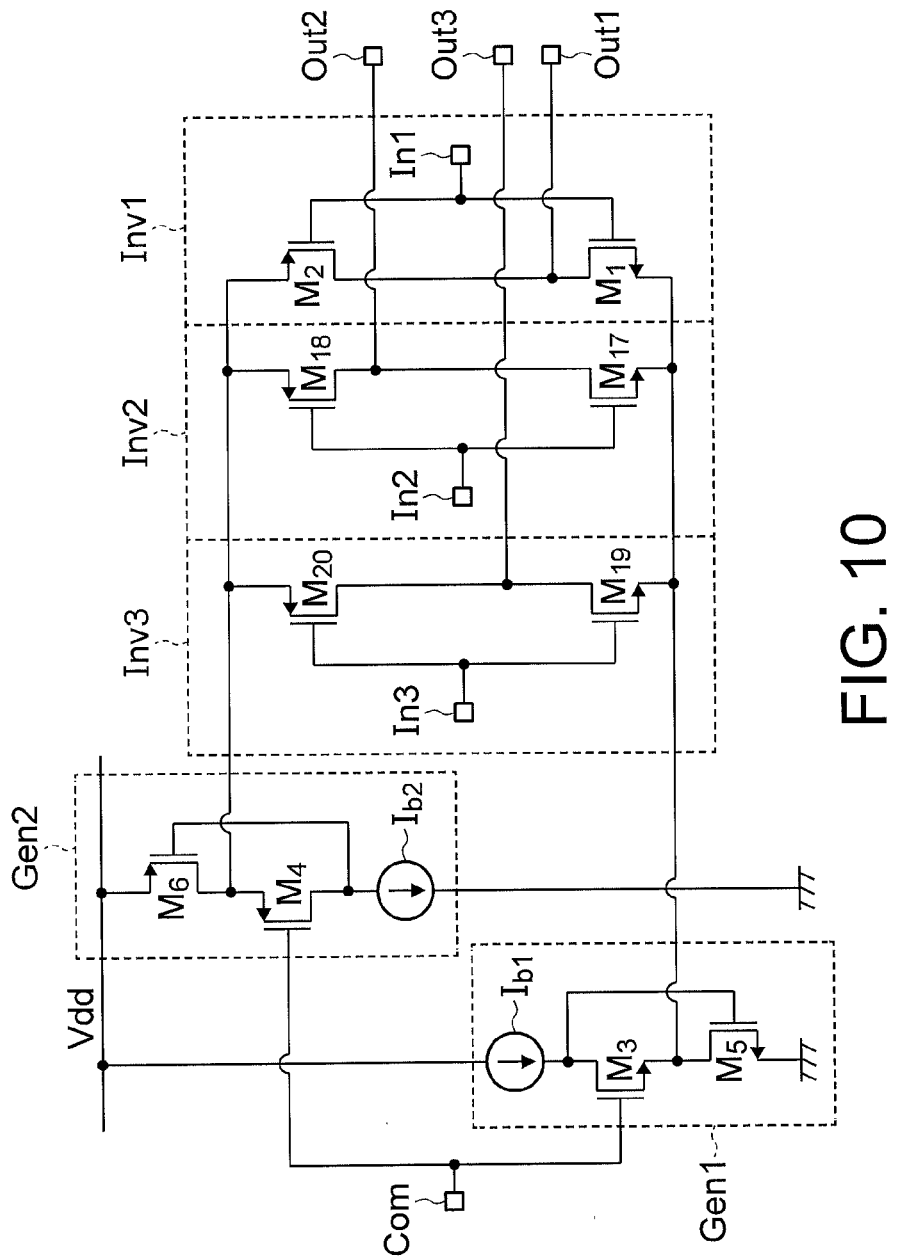
FIG. 10 is a circuit diagram illustrating an inverting amplifier according to the fourth embodiment.

FIG. 10 is a circuit diagram illustrating an inverting amplifier including three inverter circuits Inv1, Inv2, and Inv3. The inverting amplifier of FIG. 10 is the same as that of FIG. 1 except for the number of the inverter circuits. The inverter circuits Inv1, Inv2, and Inv3 have input terminals Ini (i=1, 2, and 3), output terminals Outi (i=1, 2, and 3), NMOS transistors (M1, M17, and M19), and PMOS transistors (M2, M18, and M20), respectively.

Figure 11:
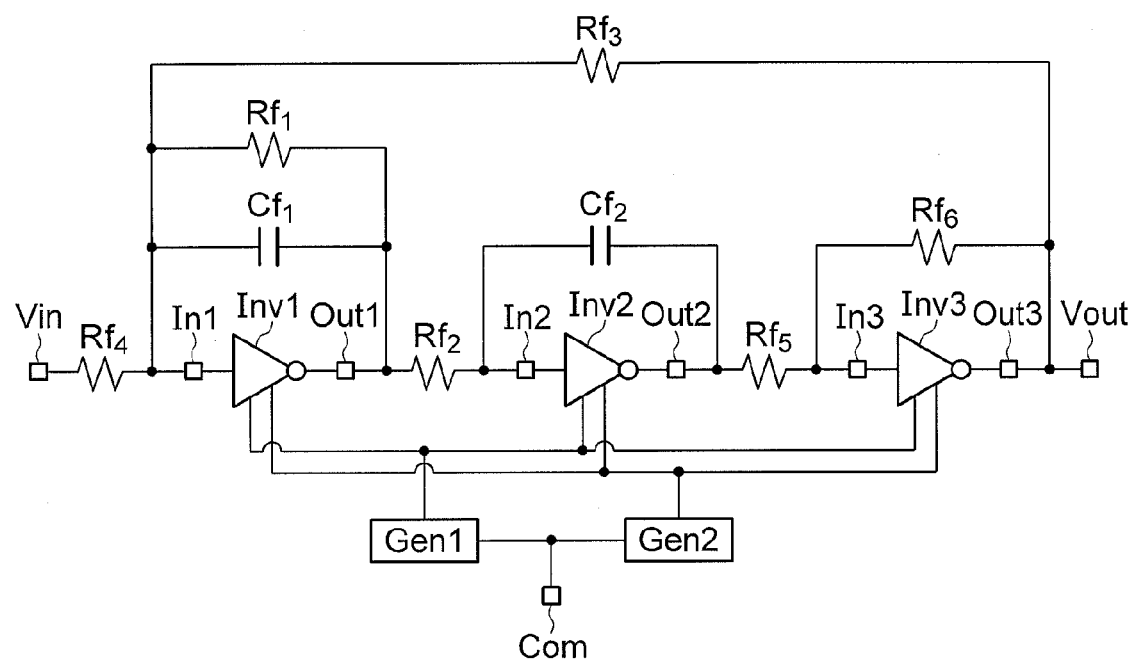
FIG. 11 is a circuit diagram illustrating a biquad filter equipped with the inverting amplifier of FIG. 10.

The inverting amplifier of FIG. 10 is applicable to a biquad filter. FIG. 11 is a circuit diagram illustrating a biquad filter including the inverting amplifier of FIG. 10. In the biquad filter of FIG. 11, the inverter circuits Inv1, Inv2, and Inv3 are serially connected. More specifically, the input terminal Vin of the biquad filter and the input terminal In1 of the inverter circuit Inv1 are connected together via the resistance element Rf4, the output terminal Out1 of the inverter circuit Inv1 and the input terminal In2 of the inverter circuit Inv2 are connected together via the resistance element Rf2, and the output terminal Out2 of the inverter circuit Inv2 and the input terminal In3 of the inverter circuit Inv3 are connected together via the resistance element Rf5. Moreover, the capacitative element Cf1 and the resistance element Rf1 are connected in parallel with each other between the input terminal In1 and the output terminal Out1 of the inverter circuit Inv1, the capacitative element Cf2 is connected between the input terminal In2 and the output terminal Out2 of the inverter circuit Inv2, the resistance element Rf6 is connected between the input terminal In3 and the output terminal Out3 of the inverter circuit Inv3, and the resistance element Rf3 is connected between the input terminal In1 of the inverter circuit Inv1 and the output terminal Out3 of the inverter circuit Inv3.

With the above configuration, it becomes possible to set a bias current to a predetermined current value in a case where the input voltage Vin input from the input terminal Vin has a small signal component, as well as to form a biquad filter having excellent ability of driving currents in a case where the signal component is large.

It should be noted that the inverting amplifier according to the embodiment may have four or more inverter circuits and the number of the inverter circuits may be freely designed depending on the intended use.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An inverting amplifier, comprising:
   an inverter circuit;
   a first voltage generating circuit; and
   a second voltage generating circuit,
   the inverter circuit comprising
      an input terminal,
      an output terminal,
      a first first-conductivity transistor comprising a control terminal connected to the input terminal, one end connected to the output terminal, and other end, and
      a first second-conductivity transistor comprising a control terminal connected to the input terminal, one end connected to the output terminal, and other end,
   the first voltage generating circuit comprising
      a first current source supplying a first current,
      a second first-conductivity transistor comprising a control terminal with a first bias voltage applied, one end connected to the other end of the first first-conductivity transistor, and other end connected to the first current source, and
      a third first-conductivity transistor comprising a control terminal connected to the other end of the second first-conductivity transistor, one end connected to the one end of the second first-conductivity transistor, and other end, and
   the second voltage generating circuit comprising
      a second current source supplying a second current,
      a second second-conductivity transistor comprising a control terminal with the first bias voltage applied, one end connected to the other end of the first second-conductivity transistor, and other end connected to the second current source, and
      a third second-conductivity transistor comprising a control terminal connected to the other end of the second second-conductivity transistor, and one end connected to the one end of the second second-conductivity transistor.

2. The amplifier according to claim 1, further comprising a first level shift circuit between the control terminal of the third first-conductivity transistor and the other end of the second first-conductivity transistor, to lower a voltage of the control terminal of the third first-conductivity transistor so as to become lower than a voltage of the other end of the second first-conductivity transistor.

3. The amplifier according to claim 1, further comprising a second level shift circuit between the control terminal of the third second-conductivity transistor and the other end of the second second-conductivity transistor, to lower a voltage of the other end of the second second-conductivity transistor so as to become lower than a voltage of the control terminal of the third second-conductivity transistor.

4. The amplifier according to claim 2, wherein
   the first level shift circuit comprises a third current source and a fourth first-conductivity transistor,
   the third current source supplying a third current, and
   the fourth first-conductivity transistor having a control terminal connected to the other end of the second first-conductivity transistor, and one end connected to the control terminal of the third first-conductivity transistor and the third current source.

5. The amplifier according to claim 3, wherein
   the second level shift circuit comprises a fourth current source and a fourth second-conductivity transistor, the fourth current source supplying a fourth current, and
the fourth second-conductivity transistor having a control terminal connected to the other end of the second second-conductivity transistor, and one end connected to the control terminal of the third second-conductivity transistor and the fourth current source.

6. The amplifier according to claim 2, wherein
the first level shift circuit comprises a fifth current source and a fifth second-conductivity transistor,
the fifth current source supplying a fifth current, and
the fifth second-conductivity transistor comprising a control terminal with a fifth voltage applied, one end connected to the other end of the second first-conductivity transistor, and other end connected to the control terminal of the third first-conductivity transistor and the fifth current source.

7. The amplifier according to claim 3, wherein
the second level shift circuit comprises a sixth current source and a fifth first-conductivity transistor,
the sixth current source supplying a sixth current, and
the fifth first-conductivity transistor having a control terminal with a sixth voltage applied, one end connected to the other end of the second second-conductivity transistor, and other end connected to the control terminal of the third second-conductivity transistor and the sixth current source.

8. The amplifier according to claim 2, wherein
the first level shift circuit comprises a seventh current source and a first resistance element,
the seventh current source supplying a seventh current, and
the first resistance element comprising one end connected to the other end of the second first-conductivity transistor, and other end connected to the control terminal of the third first-conductivity transistor and the seventh current source.

9. The amplifier according to claim 3, wherein
the second level shift circuit comprises an eighth current source and a second resistance element,
the eighth current source supplying a eighth current, and
the second resistance element having one end connected to the other end of the second second-conductivity transistor, and other end connected to the control terminal of the third second-conductivity transistor and the eighth current source.

10. The amplifier according to claim 1, wherein
the inverter circuit comprises
a sixth first-conductivity transistor between the one end of the first first-conductivity transistor and the output terminal, and
a sixth second-conductivity transistor between the one end of the first second-conductivity transistor and the output terminal,
the sixth first-conductivity transistor comprising a control terminal with a seventh voltage applied, one end connected to the one end of the first first-conductivity transistor, and other end connected to the output terminal, and
the sixth second-conductivity transistor comprising a control terminal with a seventh voltage applied, one end connected to the one end of the first second-conductivity transistor, and other end connected to the output terminal.

11. The amplifier according to claim 1, comprising a plurality of inverter circuits wherein the plurality of inverter circuits comprises the inverter circuit.

\* \* \* \* \*